United States Patent [19]

McIntosh

[11] 4,001,811
[45] Jan. 4, 1977

[54] METHOD AND APPARATUS FOR CODING AND DECODING DIGITAL INFORMATION

[75] Inventor: Duane E. McIntosh, Palmyra, Wis.

[73] Assignee: General Motors Corporation, Detroit, Mich.

[22] Filed: Jan. 28, 1972

[21] Appl. No.: 221,693

[52] U.S. Cl. .................................. 340/347 DD
[51] Int. Cl.² .................................. H03K 13/24
[58] Field of Search ............ 340/347 DD, 174.1 G; 346/74 M; 178/66, 67, 68; 328/55

[56] References Cited
UNITED STATES PATENTS

| | | | |
|---|---|---|---|
| 3,281,866 | 10/1966 | Lawrance et al. | 340/174.1 G |
| 3,374,475 | 3/1968 | Gabor | 340/174.1 G |
| 3,488,663 | 1/1970 | Rosenblatt | 346/74 M |
| 3,560,947 | 2/1971 | Franchini | 346/74 M |
| 3,564,557 | 2/1971 | Ruthazer | 340/347 DD |
| 3,623,041 | 11/1971 | MacDougall, Jr. | 340/174.1 G |
| 3,671,960 | 6/1972 | Sollman et al. | 340/347 DD |

*Primary Examiner*—Charles D. Miller
*Attorney, Agent, or Firm*—Albert F. Duke

[57] ABSTRACT

An NRZL bit stream is encoded by shifting the bit stream through a 9 bit storage register while logic gates detect and compare the level of adjacent bits stored in the register. The state of an output bit stream is changed if the bits stored in positions 8 and 9 of the register are alike and the change occurs at one or the other of two different times during bit time depending upon whether the pair of like bits are "1's" or "0's". If in addition to the detection of a pair of like bits in positions 8 and 9, an alternate bit pattern is detected in positions 1 through 7 of the register, changes in the output bit stream are forced at a rate of 1½ bit time intervals until a pair of like bits are detected in positions 5 and 6 of the register. The first of the 1½ bit time interval state changes occurs at 2 or 2½ bit times after the state change resulting from detection of a pair of like bits depending upon the level of the bits stored in position 7 of the register. If the bit stored in position 7 of the register is the same as the bits stored in positions 8 and 9 of the register the level of the bit stored in position 8 is inverted after detection of the pair of like bits in positions 8 and 9 so that only discrete pairs of bits are detected. The output bit stream may be subsequently decoded and converted to NRZL by detecting when a state change occurs relative to bit time and the bit time interval between successive state changes.

7 Claims, 9 Drawing Figures

METHOD AND APPARATUS FOR CODING AND DECODING DIGITAL INFORMATION

This invention relates to data processing and more particularly to an improved method and apparatus for coding and decoding digital information.

In my copending application Ser. Nos. 94,032 now abandoned and 93,983, now U.S. Pat. No. 3,791,553 both of which were filed Dec. 1, 1970 and assigned to the assignee of the present invention, coding and decoding techniques are disclosed for reducing the bandwidth requirements for transmission or recording of digital data by converting NRZL data to a coded bit stream in which state changes occur only in response to discrete pairs of like bits in the input bit stream. Consequently, during the time the NRZL data consist of an alternate bit pattern of 01 or 10, no change in the DC level of the coded bit stream results. This DC level is difficult to accurately maintain for substantial periods of time which can present problems in the recording and decoding of the data.

This problem is solved in the present invention by utilizing a unique characteristic of the basic bit pair encoding technique to break up the otherwise substantial periods of DC output. When implementing the basic bit pair encoding method the minimum bit time interval between transitions is 1½ bit times which only occurs when encoding the discrete pair of bits 00 followed by the discrete pair of bits 11 and there is never more than two consecutive transitions separated by this 1½ bit time interval. Thus, by injecting at least three transitions separated by 1½ bit time intervals, upon detection of an alternate bit pattern of substantial length the otherwise substantial periods of DC output can be eliminated. The bit configuration of the alternate bit pattern is identified by delaying the first of the 1½ bit time transitions by 2 bit times for the 10 alternate bit pattern and 2½ bit times for the 01 alternate bit pattern. The 1½ bit time transitions are terminated at least 2 bit times before a following bit pair transition to flag the termination of the alternate bit pattern. It will be apparent that in order to provide at least three transitions separated by 1½ bit times with the first and last transistors separated from bit pair transitions by at least 2 bit times the bit pair transitions must be separated by a duration of at least seven bit times in order for injection to be accomplished.

In accordance with the present invention the NRZL input bit stream is converted to a bit stream having state changes corresponding to discrete pairs of like bits as in the aforementioned patent applications. However, when two discrete pairs of like bits in the NRZL input bit stream are separated by an alternate bit pattern of seven or more bits, state changes at 1½ bit time intervals are introduced in the output bit stream following the state change associated with first discrete pairs until a minimum of two bit times prior to the next pair transition. In so doing, there is never more than one transition per 1½ bit times as in the afor mentioned application. Moreover, the coded output data is never at one level or the other level for greater than 8 bit times thereby eliminating the aforementioned problems associated with accurately maintaining a DC level in the coded output bit stream.

A more complete understanding of the present invention may be had from the following detailed description which should be read in conjunction with the drawings in which.

Figure 1:
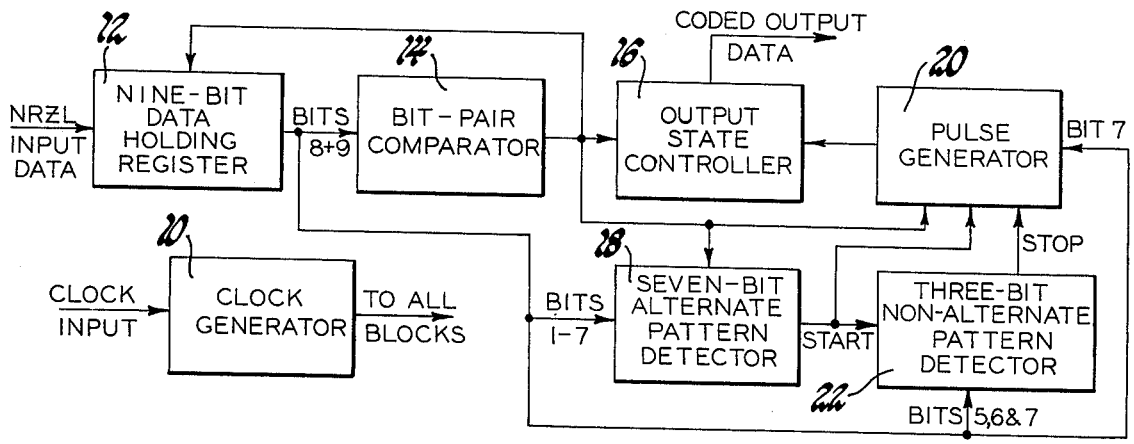
FIG. 1 is a block diagram of a preferred embodiment of the encoder of the present invention.

Referring now to the drawings and initially to FIG. 1, the encoder of the present invention includes clock generator means generally designated 10 which are synchronized with the NRZL input bit stream and produce clock pulse trains to the various function blocks of the encoder.

The encoder further includes a 9 bit data holding register generally designated 12 into which NRZL input data is serially shifted at a predetermined bit rate under the control of the clock 10. The bits stored in positions 8 and 9 of the register are compared one with the other by bit pair comparator means 14 which triggers output bit stream state controller means 16 at the beginning of bit time if bits 8 and 9 are a pair of 1's and at the middle of bit time if bits 8 and 9 are a pairs of 0's thereby producing a state change or transition between logic levels in the output bit stream. The comparator 14 also enables a 7 bit alternate pattern detector 18 and pulse generating means 20. The pulse generating means 20, when enable, produces pulses separated by 1½ bit time intervals. The detector 18 senses the level of bits 1 thorugh 7 in the register 12 and produces a START logic level output to the pulse generator means 20 when bits 8 and 9 are a pair of like bits and bits 1 through 7 are an alternate 10 or 01 pattern. The START output initiates a forced mode of encoder operation. If the pattern is an alternate 10, the pulse generating means 20 is enabled ½ bit time thereafter and forces the controller 16 to produce the first forced state change two bit times after the pair state change. If the alternate pattern is 01, the pulse generating means is enabled 1 bit times thereafter and forces the controller 16 to produce the first forced state change 2½ bit times after the pair state change. Whether the pulse generating means 20 forces a transition 2 or 2½ bit times after the pair transition is dependent upon the logic level of bit 7 which identifies the pattern as either alternate 10 or 01. The pulse generating means 20 continues to force the controller 16 to produce state changes in the output bit stream every 1½ bit times following the first forced state change until disabled by a three bit nonalternate pattern detector 22 which is responsive to the level of bits 5, 6 and 7 in the register 12. When bits 5 and 6 in the register 12 are the same logic level, a STOP logic level output is fed to the pulse generating means 20 which terminates the forced mode of operation of the encoder.

The output of the comparator 14 is also fed back to the register 12 and switches the level of bit 8 following detection of a pair of like bits if bits 7 and 8 are the same logic level so that only discrete pairs of 0's or 1's are detected and the shifting of 000 or 111 through positions 8 and 9 of the register 12 is not interpreted as two pairs of 0's or two pairs of 1's.

Figure 2:
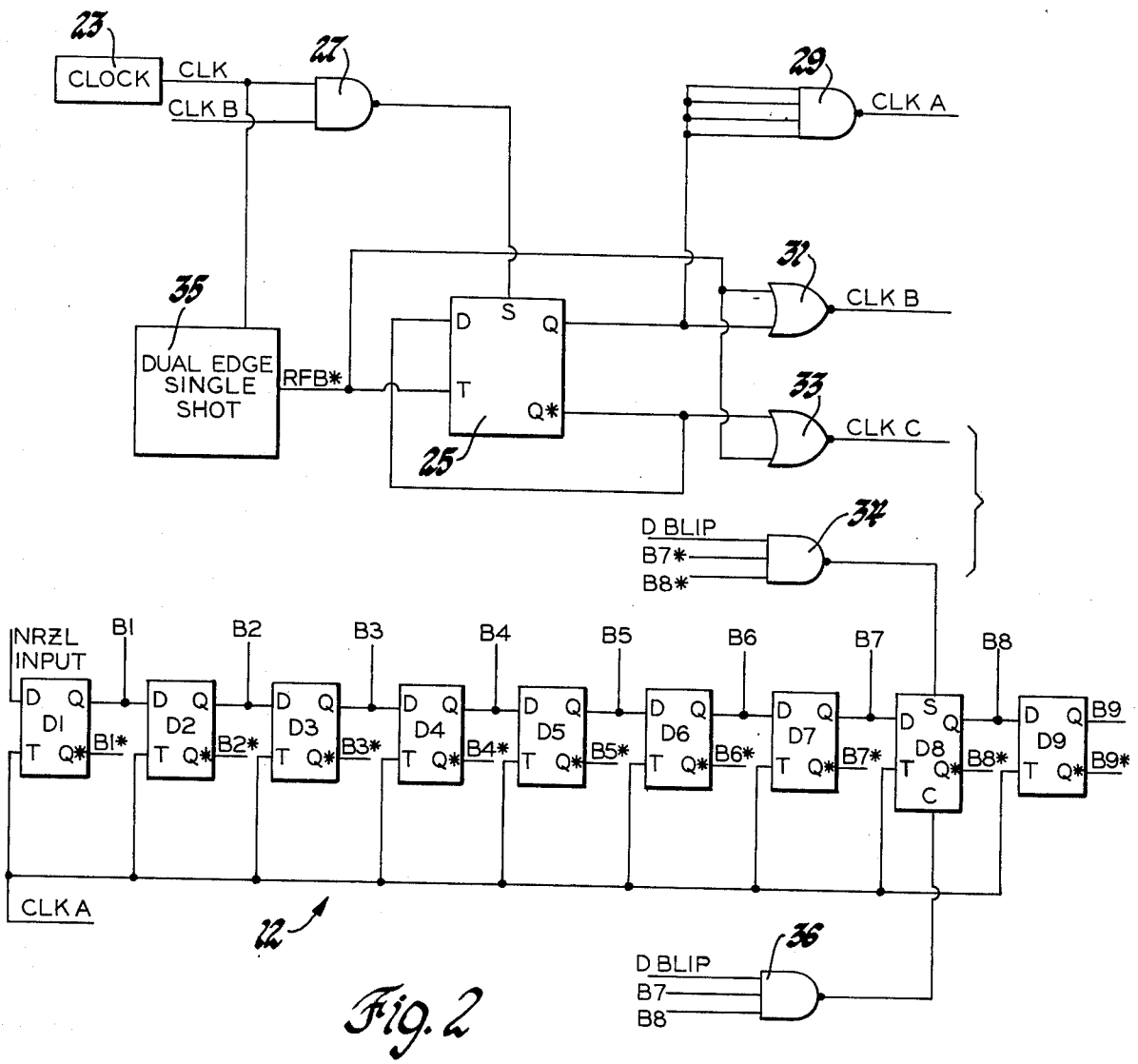
FIGS. 2 and 3 are detailed logic diagrams of the encoder of the present invention.
Figure 4:
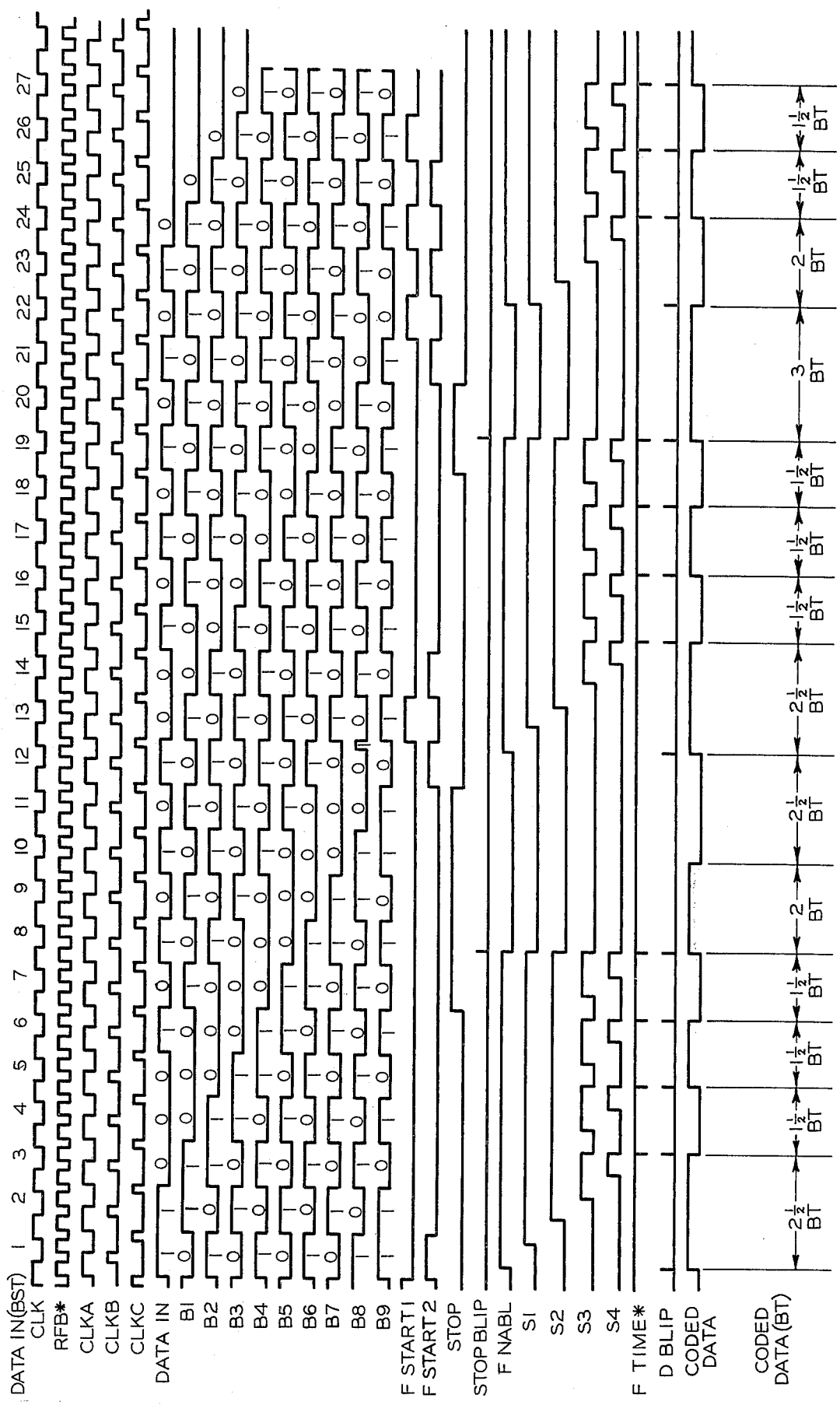
FIG. 4 is a timing chart somewhat idealized showing various voltage waveforms in the encoder of the present invention.

Referring now to FIG. 2, the clock generator 10 responds to a basic clock 23, and comprises a D flip-flop 25, NAND gates 27 and 29, and NOR gates 31 and 33. The generator 10 produces the pusle trains shown in FIG. 4 designated RFB*, CLKA, CLKB, and CLKC. The basic clock 23, the output of which is designated CLK in FIG. 4, is synchronized with the NRZL input data and feeds a dual edge single shot 35 which produces the output pulse trains designated RFB* containing negative going pulses coinciding with each rising and falling edge of the basic clock CLK. The flip-flop 25 has its Q* and D terminal coupled together and is toggled by the output of the single shot 35 which also controls the gates 31 and 33. CLKA, CLKB and CLKC are synchronized with CLK through the gate 27, which controls the setting of flip-flop 25 to insure that the various clock pulses are aligned as shown in FIG. 4. CLKA defines the bit storage time of the NRZL input data in the register 12. CLKB and CLKC respectively, define the beginning and middle of bit time of the coded output bit stream.

The 9 bit data holding register 12 comprises nine D type flip-flops D1 through D9. The NRZL input data is applied to the D input of flip-flop D1 and is serially shifted through the register 12 by CLKA. The waveform showing the level of the bits stored in positions 1 through 9 of the register 12 are designated B1 through B9 in FIG. 4 as are the Q outputs of the flip-flops D1 through D9 respectively. The Q* output of flip-flops D1 through D9 are designated B1* through B9* respectively. The * designation is used throughout this application as indicating the inverse of the prefix associated therewith.

The bit pair comparator 14 comprises a pair of four input NAND gates 24 and 26. The four inputs to the gate 24 are B8, B9, CLKB and N NABL. The four inputs to the gate 26 are B8*, B9*, CLKC and N NABL. N NABL is high to enable the gates 24 and 26 during the normal mode of operation and is low to disable the gates 24 and 26 during the forced mode of operation as will be apparent hereinafter.

The outputs of the gates 24 and 26 are inputs to a NAND gate 28. A third input to the gate 28 is designated F TIME* which is received from the pulse generating means 20 to be hereinafter described in detail.

The output of gate 28 is designated D BLIP and toggles a D type flip-flop 30 having its Q* output terminal connected with its D input terminal. The Q* output of flip-flop 30 is inverted by NAND gate 32 to produce a coded data output bit stream which changes states each time the flip-flop 30 is toggled.

NAND gates 34 and 36 are connected respectively with the SET and CLEAR inputs on flip-flop D8 of the register 12. The inputs to the gate 34 are B7*, B8*, and D BLIP, and the inputs to the gate 36 are B7, B8 and D BLIP.

The apparatus thus far described is essentially the same as that disclosed in the aforementioned patent application Serial No. 94,032 and operates as follows: if the NRZL input data shifted into the register 12 is such that logic 1's appear at B8 and B9, all inputs to gate 24 in the comparator 14 will be a logic 1 so that a pulse corresponding to a CLKB pulse will be developed at the output of gate 28, and will toggle the flip-flop 30. The Q* output of flip-flop 30 is inverted by the gate 32 and causes a transition or state change in the output bit stream from the level existing at the time of the pulse, to the other level. At the same time, the output of gate 36 goes low clearing flip-flop F9 and switching B8 from a 1 to a 0 of B7 is a 1. By switching the logic level of B8 upon detection of three bits at the same logic level in positions 7, 8 and 9 of the register, the gates 24 and 26 are inhibited for one bit time and therefore detect only discrete pairs of like bits. That is to say a 111 input bit pattern will cause only one transition in the output bit stream. A similar operation occurs if logic 0's appear at B7, B8 and B9. However, in this case a pulse corresponding to a CLKC pulse is developed at the output of gate 28 and a transition in the output bit stream occurs in the middle of bit time and the output of gate 34 goes low setting flip-flop D8 and switching B8 from a 0 to a 1.

The 7 bit alternate pattern detector 18 comprises NAND gates 38, 40, 42 and 44 and NOR gates 46, 48 as well as AND/OR/INVERT logic element 50. The outputs of gates 38 and 40 go low when B1 through B7 are respectively 1010101. When the outputs of gates 38 and 40 both go low the output of gate 46 designated F START 1 goes high. Similarly, the outputs of gates 42 and 44 go low when B1 through B7 are respectively 0101010. When gates 46 and 48 both go low the output of gate 48 designated F START 2 goes high. The output of gates 46 and 48 and D BLIP are inputs to AND/OR/INVERT element 50. The element 50 develops an output designated F START containing the pulses of D BLIP which occur during the time either F START 1 or F START 2 are high. Consequently, F START contains pulses corresponding to CLKA or CLKB or F TIME* pulses whenever B8 and B9 are the same logic level and B1 through B7 are at alternate logic levels.

F START is applied to pulse generator 20 which comprises D type flip-flops D10, through D15. The Q and Q* outputs of D10 are respectively designated F NABL and N NABL while the Q outputs of the flip-flops D11 through D14 are designated S1 through S4 and the Q and Q* outputs of D15 are respectively designated F TIME and F TIME*. Whenever F TIME* goes low the output of gate 28 i.e., D BLIP goes high producing a state change in the output bit stream and also clearing flip-flops D13 through D15 driving F TIME* high and D BLIP low. The flip-flops D11 through D15 are toggled from RFB* through an inverter formed by NAND gate 52. The flip-flops D10, D11 and D12 are cleared by a signal designated STOP BLIP* while the flip-flops D13 and D14 and D15 are cleared by either D BLIP or a signal designated STOP BLIP through NOR gate 58.

A NOR gate 54 has one input coupled to the register 12 to detect the level of the bit stored in position 7 of the register while the other input is F START. The output of the gate 54 is inverted by a NAND gate 56 and applied to the set input of flip-flop D11. During the normal mode of operation the flip-flops D10, D11 and D12 are cleared to place logic 0's at the Q outputs thereof. The flip-flop D10 is set by a F START pulse to enable the forced mode of operation causing F NABL to go high. If at the time the forced mode of operation is initiated the alternate pattern is 1010101 then D7* will be low at the time of the F START pulse which sets the flip-flop D11 producing a logic 1 at the Q output thereof. If on the other hand, the alternate pattern is 0101010, B7* will be high and the flip-flop D11 will not be set and consequently a logic 0 will be at the Q output thereof. Accordingly, with the alternate 10 pattern the setting of the flip-flop D11 causes an F TIME* pulse on the fourth FRB* pulse or 2 bit times after the pulse in D BLIP which produced F START. That is to say, if the seven bits following a pair of like bits form an alternate 10 pattern, the first forced transition resulting from an F TIME* pulse occurs two bit times after the pair transition. On the other hand, if the alternate pattern is 01 the flip-flop D11 will not be set and consequently, F TIME* will not go low until the high on the Q output of D10 is transferred on the fifth FRB* pulse. That is to say if seven or more bits following a pair of like bits form an alternate 01 pattern the first forced transition resulting from an F TIME* pulse occurs 2½ bit times after the pair transition. After the first forced transition F TIME* is driven low on each third RFB* pulse producing a forced transition every 1½ times thereafter. The forced 1½ bit time transitions continue after the first forced transition until a minimum of two bit times prior to the next pair transition as determined by the non-alternate pattern detector 22.

The non-alternate pattern detector 22 functions to return the encoder to the normal mode of operation a minimum of two bit times prior to the time a pair of like bits are shifted into flip-flops D8 and D9. The detector 22 comprises a NAND gate 60 which responds to the outputs of gates 40 and 42 of the detector 18 which sense the level of bits B5, B6 and B7 in the register 12. If either B5 or B6 and B7 are the same logic level at least one input to gates 40 and 42 will be low raising both inputs to the gate 60 high which produces a low which is inverted by NAND gate 62 to produce a level change from a low to a high in the output signal designated STOP. The detector 22 further includes D type flip-flops D16 and D17 which are cleared by F START pulses and are toggled by F TIME* pulses. The D input to the flip-flop D16 is tied to a logic 1. The Q outputs of the flip-flops D16 and D17 form inputs to a NAND gate 64, the other inputs of which are STOP and F TIME. The output of the gate 64 is designated STOP BLIP* and is inverted by a NAND gate 66 to produce the output designated STOP BLIP. Prior to the pair of like bits being detected by gates 40 and 42 they already have been detected by gates 38 and 44 and would have caused F START 1 and F START 2 to go low preventing D BLIP from passing through gate 50 so that F START remains high. With F START high the flip-flops D10, D16 and D17 are released. Each subsequent pulse of F TIME* toggles the flip-flops D16 and D17. Consequently, the second forced transition following detection of a pair of like bits by the gates 38 and 44 will produce highs at the Q outputs of the flip-flops D16 and D17. Two bit times later, the pair are detected by gates 40 and 42 which causes STOP to go high. No later than 1½ bit times after the second transition following detection of a pair of like bits by the gates 38 and 44 an F TIME pulse is developed by the toggle input from RFB*. The F TIME pulse is inverted by the gate 64 producing a STOP BLIP* pulse which is inverted by gate 66 producing a STOP BLIP pulse. The STOP BLIP* pulse clears the flip-flops D10, D11 and D12 driving N NABL high and F NABL low enabling the gates 24, 26 in the comparator 14. The STOP BLIP pulse clears the flip-flops D13, D14 and D15 through the gate 58 and the encoder is returned to the normal mode of operation where it will remain until seven or more bits following a pair of like bits form an alternate bit pattern.

Figure 3:
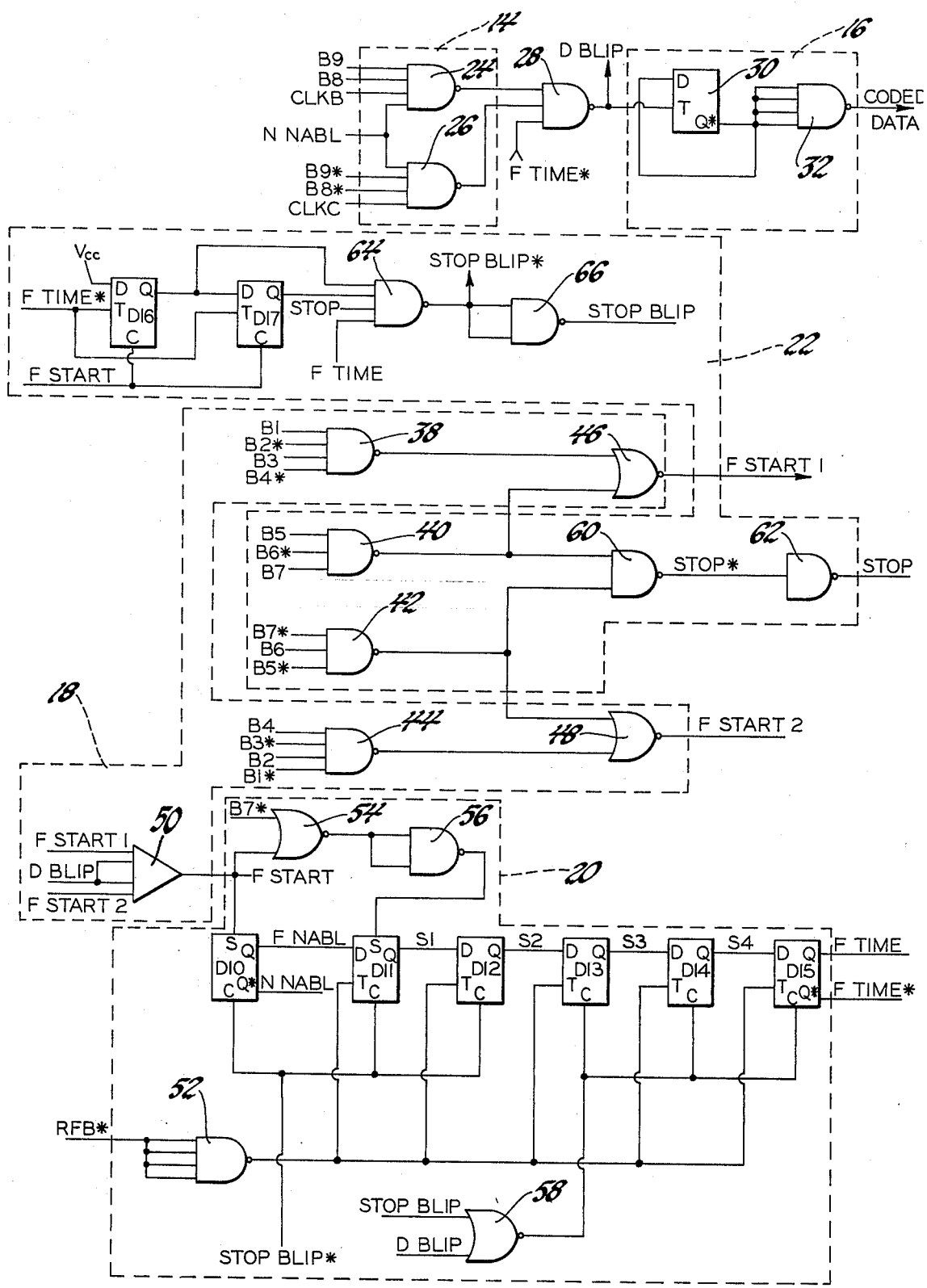

The operation of the encoder in FIG. 2 will now be described with reference to the timing diagram of FIG. 4. The NRZL input data to be converted is 010101010100101010100011010101011 and it is assumed in FIG. 3 that the first nine bits have been loaded into the register 12 so that B1 through B9 respectively is 010101011. When B1 goes low on the leading edge of CLKA the seven bits B1 through B7 form an alternate 01 pattern which causes F START 2 to go high. On the leading edge of CLKB, the fact that B8 and B9 are a logic 1 is detected by the comparator 14 driving D BLIP high, which toggles the flip-flop 30 causing a level change at the beginning of bit time 1 of the output bit stream. When D BLIP goes high, the flip-flop D10 is set causing F NABL to go high which initiates the forced mode of operation. At the same time N NABL goes low disabling the gates 24 and 26 of the comparator 14 causing D BLIP to go low. Since B7 is low, B7* is high and consequently, D11 is not set. The high on F NABL is shifted by the falling edge of RFB* so that F TIME* goes low 2½ bit times after the forced mode of operation is initiated. When F TIME* goes low, D BLIP goes high causing a transition at the middle of bit time 3 of the output bit stream and a clearing of the flip-flops D13, D14 and D15 through the gate 58 which drives F TIME* high and D BLIP low. After the 2½ bit time pulse, state changes in the output bit stream are forced at 1½ bit time intervals by a D BLIP pulse under the control of F TIME* until the flip-flops D10, D11 and D12 are cleared to place a low on the input to flip-flop D13 designated S2.

At the beginning of bit storage time (BST) 3 it will be noted that a pair of 1's are stored in positions 1 and 2 of the register causing F START 2 to go low closing the gate element 50. With the gate 50 closed the flip-flops D10 is not set and D16 and D17 are not cleared on succeeding D BLIP pulses thereby permitting flip-flops D16 and D17 to count the F TIME* pulses. The first F TIME* pulse following a low on F START 2 and closing of gate 50 toggles the flip-flop D16 driving its output high and the second F TIME* pulse drives the output of both flip-flops D16 and D17 high. When the pair of like bits which appeared at bit storage time 3 in positions 1 and 2 of the register are shifted into positions 5 and 6 of the register which occurs at the beginning of bit storage time 7, the STOP* output of gate 60 goes low and the STOP output of gate 62 goes high. The first F TIME* pulse following a high on STOP causes all inputs to the gate 64 to be high driving STOP BLIP* low and STOP BLIP high which clears the flip-flops D10, D11, and D12 and also clears flip-flops D13, D14 and D15 through the gate 58. As a result, F NABL goes low and N NABL goes high enabling the gates 24 and 26 returning the encoder to the normal mode of operation so that during bit storage time 10 the pair of 1's stored in positions 8 and 9 are detected to produce a D BLIP pulse.

At the beginning of bit storage time 12, an alternate 0101010 pattern is detected in positions 1 through 7 of the register causing F START 2 to go high. During bit storage time 12, a pair of 0's is detected in positions 8 and 9 of the register by gate 26 producing a D BLIP pulse coinciding with CLKC and a state change in the output bit stream. The D BLIP pulse coinciding with CLKC passes through gate 50 driving F NABL high once again disabling the normal mode of operation and enabling the forced mode of operation. Since the bits stored in positions 7, 8 and 9 are all 0's during bit storage time 12, production of the D BLIP pulse causes the output of the gate 36 to go low clearing flip-flop D8 and switching B8 to a 1 so that in bit storage time 13 a pair is not stored in positions 8 and 9 of the register. Since the bit stored in position 7 is a 0 the first D BLIP pulse resulting from F TIME* going low occurs 2½ bit times later. The D BLIP pulses continue at 1½ bit time intervals until a pair of like bits are stored in positions 5 and 6 of the register at the beginning of bit storage time 19 at which time STOP* goes low and STOP goes high. The next D BLIP pulse causes STOP BLIP to go high and STOP BLIP* to go low disabling the pulse generator 20.

At the beginning of bit storage time 22 a pair of 0's are stored in positions 8 and 9 and an alternate bit pattern 1010101 is stored in positions 1 through 7 of the register 12. Accordingly, at the beginning of bit storage time 22, F START 1 goes high and on the rising edge of CLKC a D BLIP pulse is produced toggling the flip-flop D10 causing F NABL to go high. Since the level of the bits stored in position 7 of the register is a logic 1, the flip-flop D11 is set so that the output is at a logic 1 as shown by the waveform S1. Accordingly, the first forced transition occurs two bit times thereafter in the middle of bit time 24 of the output bit stream. Force transitions at 1½ bit time intervals are thereafter produced until terminated on the first foced transition following storage of a piar of like bits in positions 5 and 6 of the register 12.

It should be understood that the invention is also applicable to encoding discrete pairs of unlike bits and their complement i.e. 01 and 10. In that case the intervening data containing no pairs of adjacent unlike bits would be either 1111111 or 0000000. Further, while the first of the 1½ bit time transitions are delayed by 2 or 2½ bit times from the preceding bit pair transition other delay intervals may be used but would, of course, increase the number of bits of intervening data required to initiate the successive 1½ bit time transitions.

Figure 5:
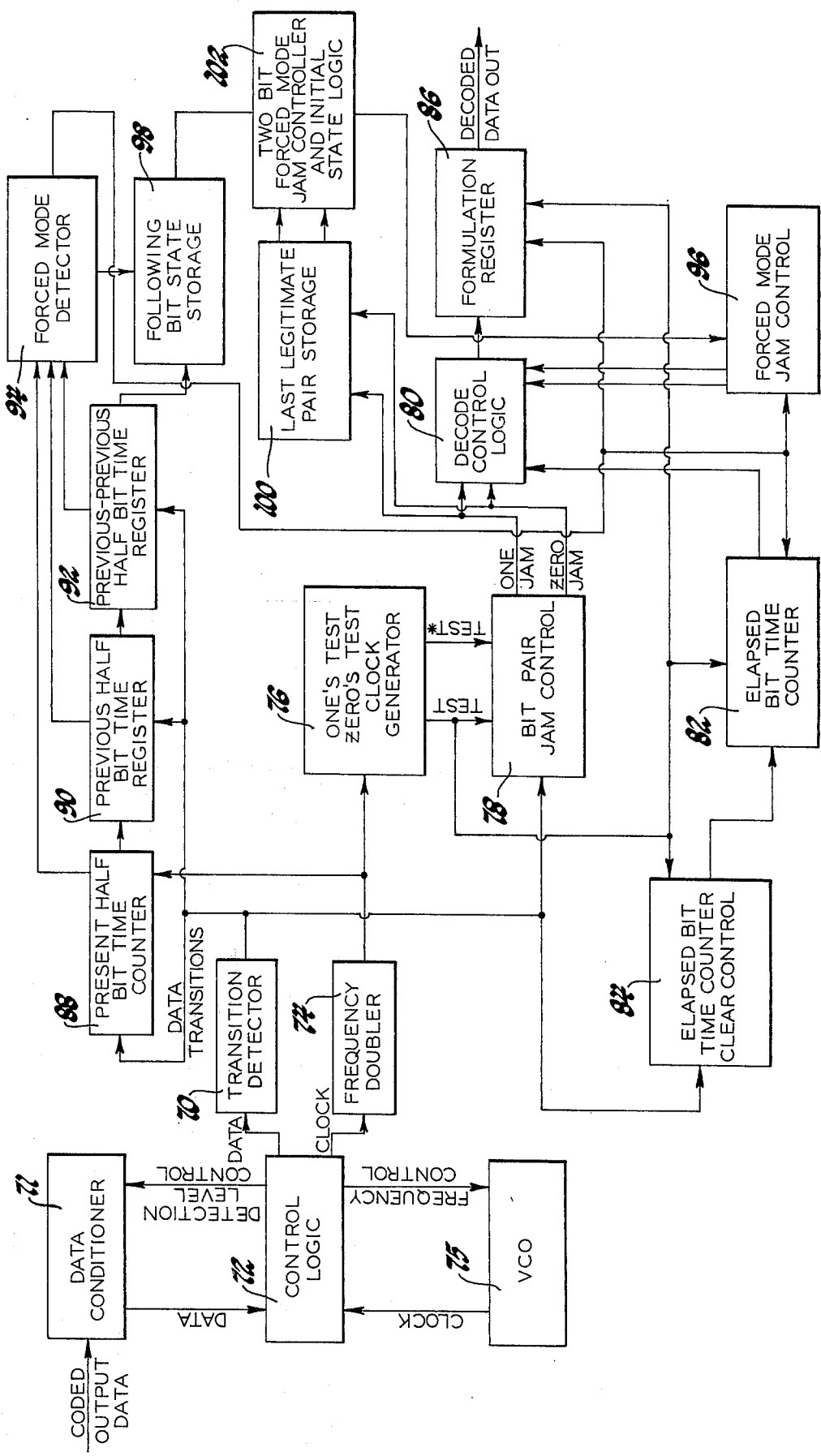
FIG. 5 is a block diagram of a preferred embodiment of the decoder of the present invention.

Referring now to FIG. 5, the decoder of the present invention includes a transition detector 70 which receives the coded input data after being condition by a data conditioner 71 under the control of logic block 72 which provides slicing level control to the conditioner 71 so that the input data is conditioned to the proper signal level, is approximately square wave in nature relative to the data transition points, and provides properly proportioned pulse widths. The decoder further includes a frequency doubler 74 which receives clock pulses from a voltage controlled oscillator 75 which is frequency and phase controlled by the logic block 72 so that the clock pulses occur at the bit rate of the input data and so that the phasing is such that the data transitions occur at the midpoint of the clock pulses.

The frequency doubler 74 provides twice bit rate clock pulses to a test clock generator 76 which produces TEST and TEST* outputs which are synchronized so that the pulses in the TEST output occur at the beginning of bit time and the pulses in the TEST* output occur at the middle of bit time. The transition detector 70 produces a transition pulse train containing pulses corresponding to each state change in the coded input bit stream which are provided to a bit pair jam control generally designated 78 which also receives the TEST and TEST* control signals. Depending upon whether a state change occurs at the beginning of bit time or at the middle of bit time, the bit pair jam control 78 provides a ONE JAM or a ZERO JAM input to decode control logic generally designated 80. An Elapsed bit time register generally designated 82 is cleared by a counter generally designated 84 which produces the clear pulse on the first TEST pulse following a transition. After being cleared, the register 82 stores the number of bit times between transitions and controls the logic 80 so that appropriate logic levels are jammed into a formulation register generally designated 86 which provides the decoded output data. A shift register counter generally designated 88 counts the number of half bit times between transitions. Registers 90 and 92 store the previous and previous/previous half bit time count. A forced mode detector generally designated 94 responds to the state of the counter 88 and registers 90 and 92 and enables a forced mode jam control 96 to set the elapsed bit time counter 82 whenever the register 92 indicates that the half bit time interval between the first and second of the four successive transitions was 4 or 5 and the register 90 and counter 88 indicate that the half bit time interval between the second and third and the third and fourth of the four successive transitions was 3. That is to say, a half bit time count between four successive transitions of 4, 3, 3 or 5, 3, 3 indicates that the transitions occurring in the input data were forced by the encoder as a result of the detection of 7 successive alternate bits following a pair of like bits. The counter 92, depending on whether it stores 4 or 5 half bit time counts identifies the state of the bit following the last legitimate pair transition and the state of this bit is stored in an element designated 98. The state of the last legitimate pair, i.e. the first of the four successive transitions, is stored in an element designated 100 which responds to the output of the bit pair jam control 78 which in turn identified the pair of like bits causing the transition in the input data. A two bit forced mode jam controller and initial state logic element designated 102 responds to the information regarding the state of the last legitimate pair and the state of the bit following the last legitimate pair identified by the elements 100 and 98 to control the forced mode jam controller 96 so that either an alternate pattern of 01 or 10 is jammed into the formulation register 86 by the logic 80 following the last legitimate pair.

Figure 6:
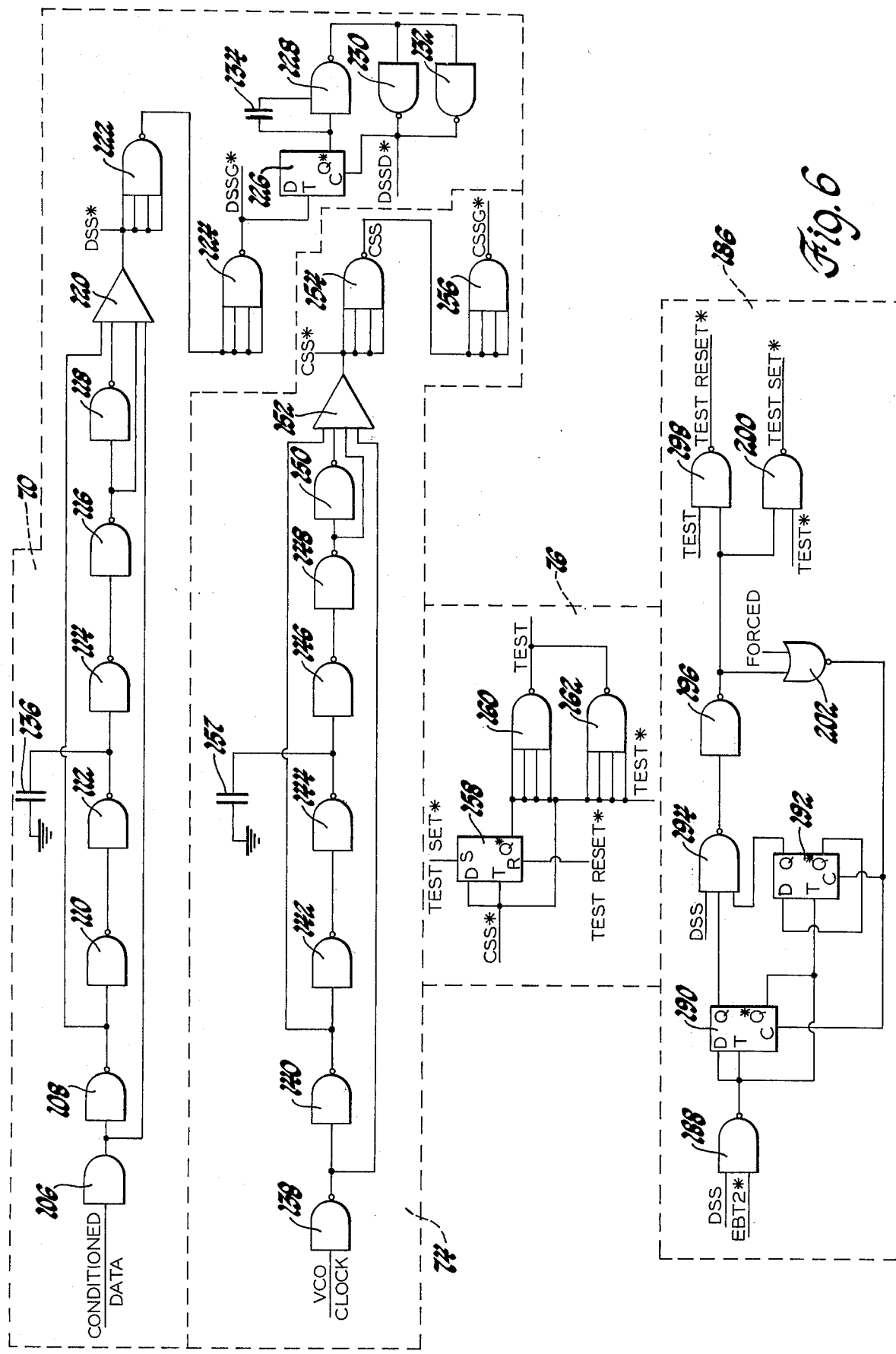
FIGS. 6, 7 and 8 are detailed logic diagrams of the decoder of the present invention.

Referring now to FIG. 6, the data transition detector 70 functions as a dual edge single shot multivibrator producing a waveform designated DSS* having pulses corresponding to each transition in the conditioned input data. The detector 70 comprises a string of NAND gates 106 through 118 and AND/OR/INVERT element 120. The DSS* output of the element 120 is twice inverted by gates 122 and 124 to boost the power and toggle a flip-flop 126. The Q* output of the flip-flop 126 is fed through a delay network comprising NAND gates 128, 130 and 132 and a capacitor 134 to produce a delayed signal designated DSSD*. The capacitor 136 widens the DSS* pulse to permit utilization of both the rising and falling edges.

The input to the frequency doubler 74 is the VCO clock which is at bit rate and which is lined up so that data transitions occur in the middle of the clock pulses. The doubler 74 comprises NAND gates 138 through 150 and AND/OR/INVERT element 152. The output of the element 152 is designated CSS* and is doubly inverted by NAND gates 154, 156 to boost the power of the CSS* signal and produce a signal designated CSSG*. The capacitor 157 is provided to adjust the timing between DSS* and CSS* so that the pulses occur at the center of the TEST pulses DSS*.

The TEST clock generator 76 comprises a D type flip-flop 158 which is toggled by the CSS* signal. The Q* output of the flip-flop 158 provides a TEST* signal which is inverted by NAND gates 160 and 162 to provide a TEST signal.

Figure 7:
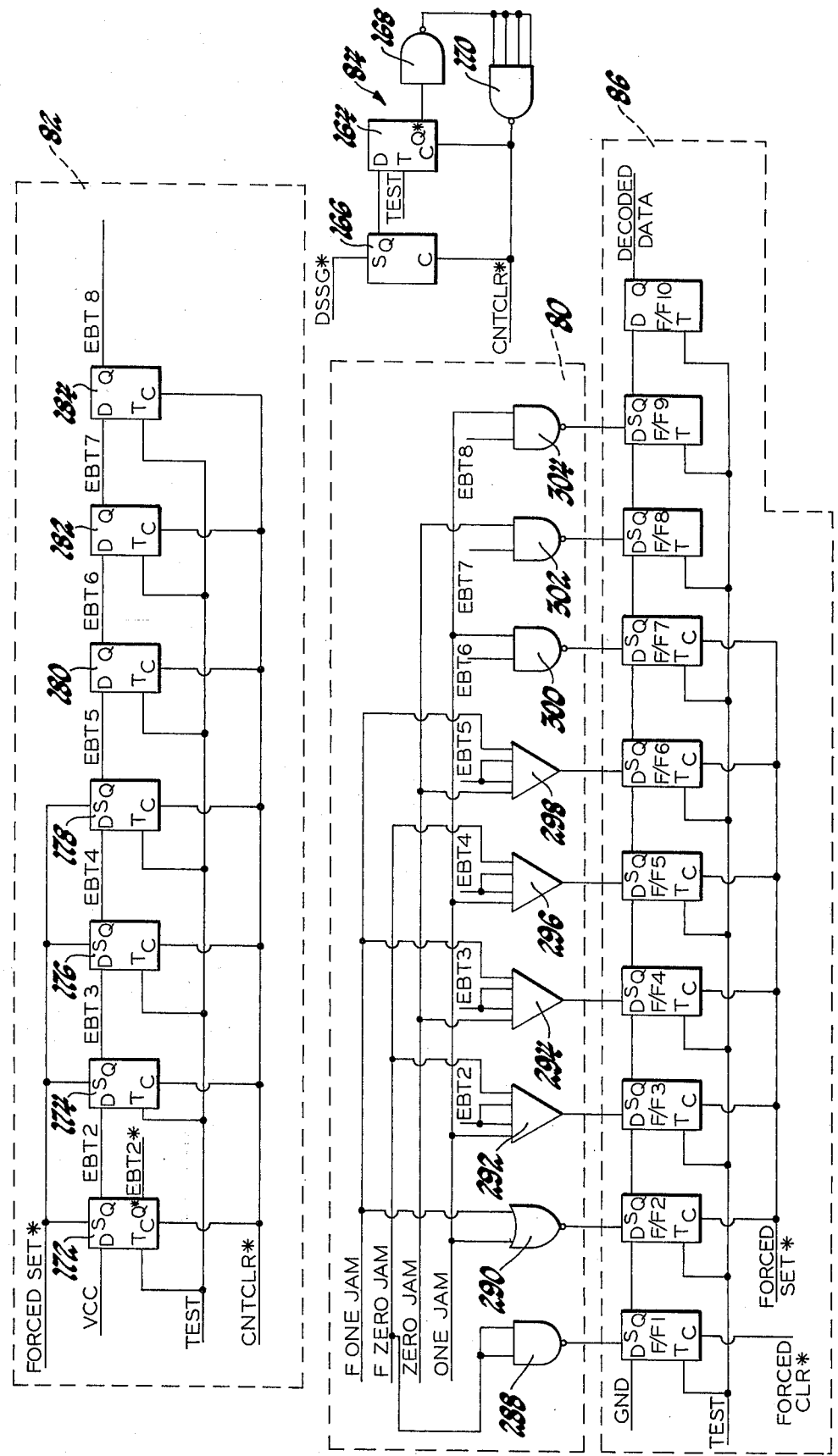

As shown in FIG. 7, the TEST output signal of the generator 76 is fed to the elapsed bit time counter clear control 84 where DSSG*. toggles a D type flip-flop 164 having its D input connected with the Q output of a D type flip-flop 166 which is set by the DSSG* signal. The Q* output of the flip-flop 164 is twice inverted by NAND gates 168 and 170 to boost the power and provide a signal designated CNTCLR* which clears the flip-flops 164 and 166. The CNTCLR* output of the control 84 is produced on the first rising edge of the TEST signal following a transition in the input data as represented by DSSG:. The CNTCLR* signal clears the 7 stage elapsed bit time counter 82 which comprises D type flip-flops 172 through 184. The flip-flops 172 through 184 are toggled by the rising edge of the TEST signal. The D input to the flip-flop 172 is tied to a logic 1. The Q output of the flip-flops 172 through 184 are cleared to a logic 0 by CNTCLR* which as previously mentioned, occurs on the first rising edge of the TEST signal following a transition. Accordingly, on the second rising edge of TEST following a transition which represents two elapsed bit times, the Q output of flip-flop 172 goes high. One bit time later, the Q output of flip-flop 174 goes high and so forth through flip-flop 184 until a transition occurs which produces a CNTCLR* pulse which clears the counter 82. Since the Q outputs of the flip-flops 172 through 184 go high to represent two through eight elapsed bit times respectively, following a transition, the Q outputs of the flip-flops 172 through 184 are designated EBT2 through EBT8.

Referring again to FIG. 6, the Q* output of flip-flop 172 is designated EBT2* and is utilized to synchronize the TEST signal by means of a TEST time clock synchronizer generally designated 186. The synchronizer 186 comprises a NAND gate 188 having inputs connected to DSS and EBT2*. The output of the gate 188 toggles D type flip-flops 190 and 192 having their Q outputs connected with a NAND gate 194. The other input to the gate 194 is DSS. The output of the gate 194 is inverted by NAND gate 196 and applied as one input to NAND gates 198 and 200. The other inputs to the gates 198 and 200 are respectively TEST and TEST*. Under the coding method of the present invention and shortest time between transitions generated by bit pairs is 1½ bit times which occurs on a 0011 bit pattern. If the TEST and TEST* signals are properly phased, TEST will be low and TEST* will be high at the time of a transition representing the pair of 0's and reversed at the time of the transition representing the pair of 1's If TEST and TEST* are out of phase the reverse will be true. If TEST is out of phase, i.e., is high at the time of the transition, the next rising edge of TEST will produce a CNTCLR pulse which clears flip-flop 172 placing a high on EBT2*. Accordingly, the following transition will toggle the flip-flop 190 placing a high on the Q output thereof. The next transition places a low at the Q output of flip-flop 190 and a high at the Q output of flip-flop 192. The first transition after three occurrences of state changes separated by 1½ bit time intervals causes the Q outputs of both flip-flops 190 and 192 to go high so that all inputs to the gate 194 are high producing a high output from the gate 196. If TEST is high at the time of the transition causing a high output from the gate 196, TEST RESET* goes low resetting the flip-flop 158 in the clock generator 76 thereby reversing the phase of TEST and TEST*. On the other hand if TEST is low, TEST SET* goes low setting the flip-flop 158 thereby reversing the phase of TEST and TEST*. Also, when the output of gate 196 goes high the output of a NOR gate 202 is driven low to clear the flip-flops 190 and 192.

Figure 8:
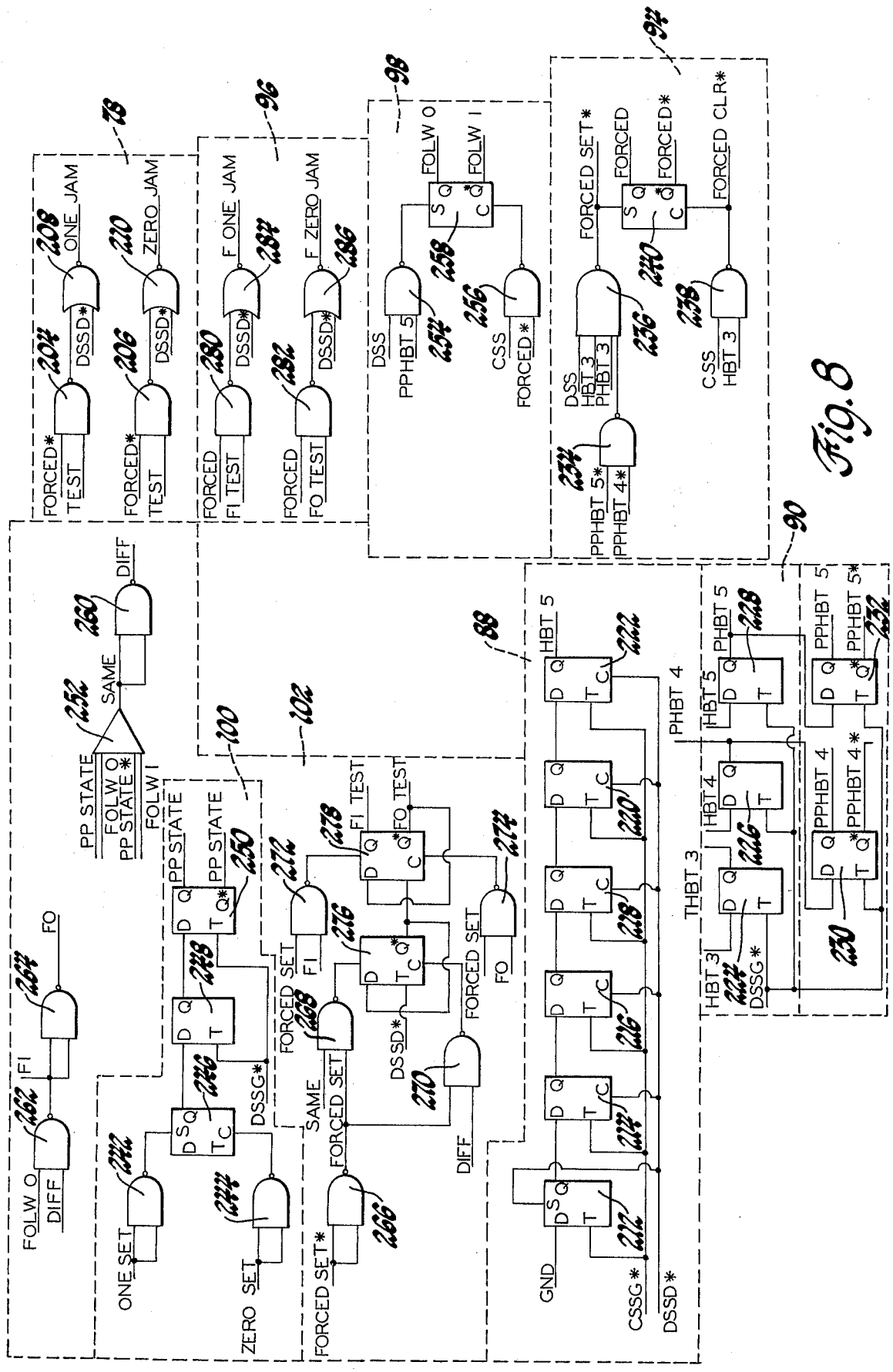

Referring to FIG. 8 the TEST and TEST* outputs are fed to bit pair jam control 78 which comprises NAND gates 204 and 206 and NOR gates 208 and 210. Assuming the decoder is not in the forced mode of operation, FORCE* is high and accordingly, the outputs of gates 204 and 206 go low on the rising edge of TEST and TEST* respectively. Accordingly, when a transition occurs, and therefore DSSD* goes low, if TEST is high, one JAM goes high. On the other hand, if at the time DSSD* goes low, TEST* was high, then ZERO JAM goes high.

The present one-half bit time counter 88 comprises six D type flip-flops 212 through 222. The previous half-bit time counter 90 comprises D type flip-flops 224, 226, and 228 while the previous/previous half bit time counter 92 comprises D type flip-flops 230 and 232. The counters 90 and 92 are toggled on the rising edge of DSSD* while the counter 88 is toggled on the rising edge of CSSG*. The D input to the flip-flop 212 is held at a logic 0 and the Q output of flip-flop 212 is set to a logic 1 by DSSD*. The remaining flip-flops 214 through 222 of the counter 80 are cleared by DSSD* placing a logic 0 at their respective Q outputs. The Q outputs of the flip-flops 218, 220, and 222 are respectively designated HBT3, HBT4, and HBT5, since these outputs are toggled to a logic 1 after 3, 4 and 5 half bit times respectively following a transition as represented by DSSD*. HBT3, HBT4 and HBT5 are connected with the D input of flip-flops 224, 226 and 228 of the counter 90 and are toggled respectively to the Q outputs of flip-flops 224, 226 and 228 on the next transition as represented by DSSG*. The Q outputs of the flip-flops 224, 226 and 228 are designated PHBT3, PHBT4, and PHBT5 respectively. Accordingly, on the transition represented by DSSG* the half bit time count stored in the register 88 is transferred to the register 90 to represent the previous half bit time count. PHBT4 and PHBT5 are connected with the D inputs of the flip-flops 230 and 232 respectively of the counter 92. The flip-flops 230 and 232 are also toggled by the rising edge of DSSG* so that the state of the previous/previous half bit time count is stored by either the flip-flop 230 or 232 depending upon whether the previous/previous half bit time count was 4 or 5.

The forced mode detector 94 comprises NAND gates 234, 236, and 238 and a D type flip-flop 240 and are interconnected with the counters 88, 90 and 92 as shown. If the previous/previous half bit time count is either 4 or 5, one or both of the inputs PPHBT4* and PPHBT5* will be low forcing the output of the gate 234 high. If the previous half bit time was 3 and the present half bit time is 3 then all inputs to the gate 236 will be high when DSS goes high causing the output of the gate 236 designated FORCED SET* to go low. When FORCED SET* goes low the flip-flop 240 is set causing the Q output thereof designated FORCED to go high and the Q* output thereof designated FORCED* to go low. The flip-flop 240 is cleared on the rising edge of CSS whenever the present half bit time is greater than 3 in which event both CSS and HBT3 will be high causing the output of the gate 238 designated FORCED CLR* to go low clearing flip-flop 240 causing FORCED to go low and FORCED* to go high.

The last legitimate pair storage 100 comprises a pair of NAND gates 242 and 244 responsive to ONE JAM and ZERO JAM respectively for respectively setting and clearing a D type flip-flop 246. If a transition represents a pair of 1's the Q output of flip-flop 246 is set high. Conversely, if a transition represents a pair of 0's the Q output of flip-flop 246 is cleared low. On succeeding transitions DSSG* toggles D type flip-flops 248 and 250 so that if a pair of 1's causes a transition the Q output of flip-flop 250 will go high two transitions thereafter. Conversely, if a pair of 0's causes the transition the Q* output of the flip-flop 250 will go high two transitions thereafter. The Q and Q* outputs of the flip-flop 250 are designated PP STATE and PP STATE* and form inputs to AND/OR/INVERT element 252. The other inputs to the AND/OR/INVERT element 252 represent the state of the bit following a pair and is obtained from the following bit state storage 98 which comprises a pair of NAND gates 254 and 256 and a D type flip-flop 258. If the decoder is not in the forced mode of operation, FORCED* will be high and the flip-flop 258 will be cleared on each rising edge of CSS causing the Q* output of the flip-flop 258 designated FOLWI to be high and the Q output of the flip-flop 258 designated FOLWO to be low. It will be recalled from the encoding method that if the 7 bit alternate pattern following a pair began with a 0 the first forced transition occured four half bit times after the transition associated with the pair and that if the seven bit alternate pattern began with a 1 the first forced transition occurred five half bit times after the transition associated with the pair. Accordingly, the gate 254 goes low to set the flip-flop 258 so that FOLWO goes high if five half bit times occurred between the previous and the previous/previous transition, since in that event PPHBT5 will be high and the output of the gate 254 will go low when DSS goes high. Referring again to the controller 102, if the PP STATE is high indicative of a transition associated with a pair of 1's and the pair of 1's is followed by a 0 so that FOLWO is high then the output of the element 252 will be low which is inverted by the gate 260 to produce a high on the output thereof designated DIFF and indicating when high, that a 0 followed a pair of 1's. Alternatively, if PP STATE* is high and FOLWI is high indicative of a situation where a 1 followed a pair of 0's then SAME will be low and DIFF will be high once again indicating that the pair causing the transition and the bit following the pair are at different logic levels. Conversely, it will be apparent that if a 0 follows a pair of 0's or if a 1 follows a pair of 1's then the output of the element 252 will be high and the output of the gate 260 will be low indicating that the pair and bit following the pair are the same logic level. The DIFF output of the gate 260 and the FOLWO output of the flip-flop 258 provide inputs to a NAND gate 262 providing an output designated F1 which is inverted by NAND gate 264 providing an output designated F0. If the bit following the pair is a 0 and the pair is different from the following bit then F1 will be low and F0 will go high.

The FORCED SET* output of the gate 236 of the detector 94 is inverted by NAND gate 266 and applied as one input to NAND gates 268 and 270 as well as one input to NAND gate 272 and 274. The other inputs to the gates 268 and 270 are SAME and DIFF respectively, while the other inputs to the gates 272 and 274 are F1 and F0 respectively. The gates 268 and 270 control the setting and clearing respectively of a D type flip-flop 276 while the gates 272 and 274 control the setting and clearing respectively of a D type flip-flop 278. The flip-flops 276 and 278 have their Q* output and D input interconnected. The flip-flop 176 is toggled from DSSD* while the flip-flop 278 is toggled from the Q* output of the flip-flop 276. The Q and Q* outputs of the flip-flops 278 are respectively designated F1 TEST and F0 TEST.

If the detector 94 detects as a result of the half bit time intervals between transitions in the incoming coded bit stream that the transitions were forced by the encoder and F0 is high indicating that the last legitimate pair transition represented a pair of 1's followed by a 0, then both inputs to the gate 270 will be high as will both inputs to the gate 274 causing the flip-flops 276 and 278 to be cleared causing F0 TEST to go high. If on the other hand, the last legitimate pair was 00 followed by a 0 or if the last legitimate pair was 11 followed by a 1, then F1 will be high as will SAME so that both flip-flops 276 and 278 are SET, causing F1 TEST to go high.

The initial state of F1 TEST upon entering the FORCED mode of operation as well as its state during consecutive transitions while in the FORCED mode of operation as shown below in CHART A for the various combinations of pairs and following bits.

CHART A

| IF | STATE OF F1 TEST |
|---|---|
| 110 | 0011001100 |
| 111 | 1001100110 |
| 000 | 1001100110 |
| 001 | 1100110011 |

The FORCED mode jam control 96 is similar to the bit pair jam control 78 comprising NAND gates 280 and 282 and NOR gates 284 and 286. One input to the gates 280 and 282 is FORCED while the other inputs are respectively F1 TEST and F0 TEST. The output of NOR gate 284 designated F ONE JAM goes high when DSSD* goes low following a high on FORCED and on F1 TEST. The output of NOR gate 286 designated F ZERO JAM goes high when DSSD* goes low following a high on FORCED and F0 TEST.

Referring again to FIG. 7, the formulation register 86 comprises 10 D type flip-flops designated FF1 through FF10. The flip-flops FF1 through FF10 are toggled by the rising edge of TEST. The D input of the flip-flop FF1 is tied to a logic 0 while succeeding flip-flops FF2 through FF10 have their D input tied to the Q output of the previous stage. The flip-flops FF2 through FF6 are cleared placing a logic 0 at the Q outputs thereof on the leading edge of FORCED SET* while the flip-flop FF1 is cleared on the leading edge of FORCED CLR*.

Flip-flops FF1 through FF9 of the formulation register are further controlled by decode control logic 80 comprising gate elements 288 through 304 which respectively pass certain ones of the control signals ONE JAM, ZERO JAM, F ONE JAM, and F ZERO JAM depending upon the elapsed bit time count since the previous transition as stored by the counter 82.

The Q output of FF1 is set high from a NAND gate 288 having its inputs tied to F ZERO JAM. The Q output of FF2 is set high from a NOR gate 290 if either ONE JAM or F ONE JAM goes high. The Q output of FF3 is set high from AND/OR/INVERT element 292 if EBT2 is high and either ONE JAM or F ONE JAM is high. The Q output of FF4 is set high from AND/OR/INVERT element 294 whenever EBT3 is high and either ZERO JAM or F ONE JAM is high. The Q output of FF5 is set high by AND/OR/INVERT element 296 whenever EBT4 is high and either ONE JAM or F ZERO JAM is high. The Q output of FF6 is set high from AND/OR/INVERT element 298 whenever EBT5 is high and either ZERO JAM or F ONE JAM is high. The Q output of FF7 is set high from a NAND gate 300 whenever ONE JAM is high and EBT6 is high. The Q output of FF8 is set high from a NAND gate 302 whenever EBT7 is high and ZERO JAM is high. The Q output of FF9 is set high from a NAND gate 304 whenever ONE JAM is high and EBG8 is high.

Figure 9:
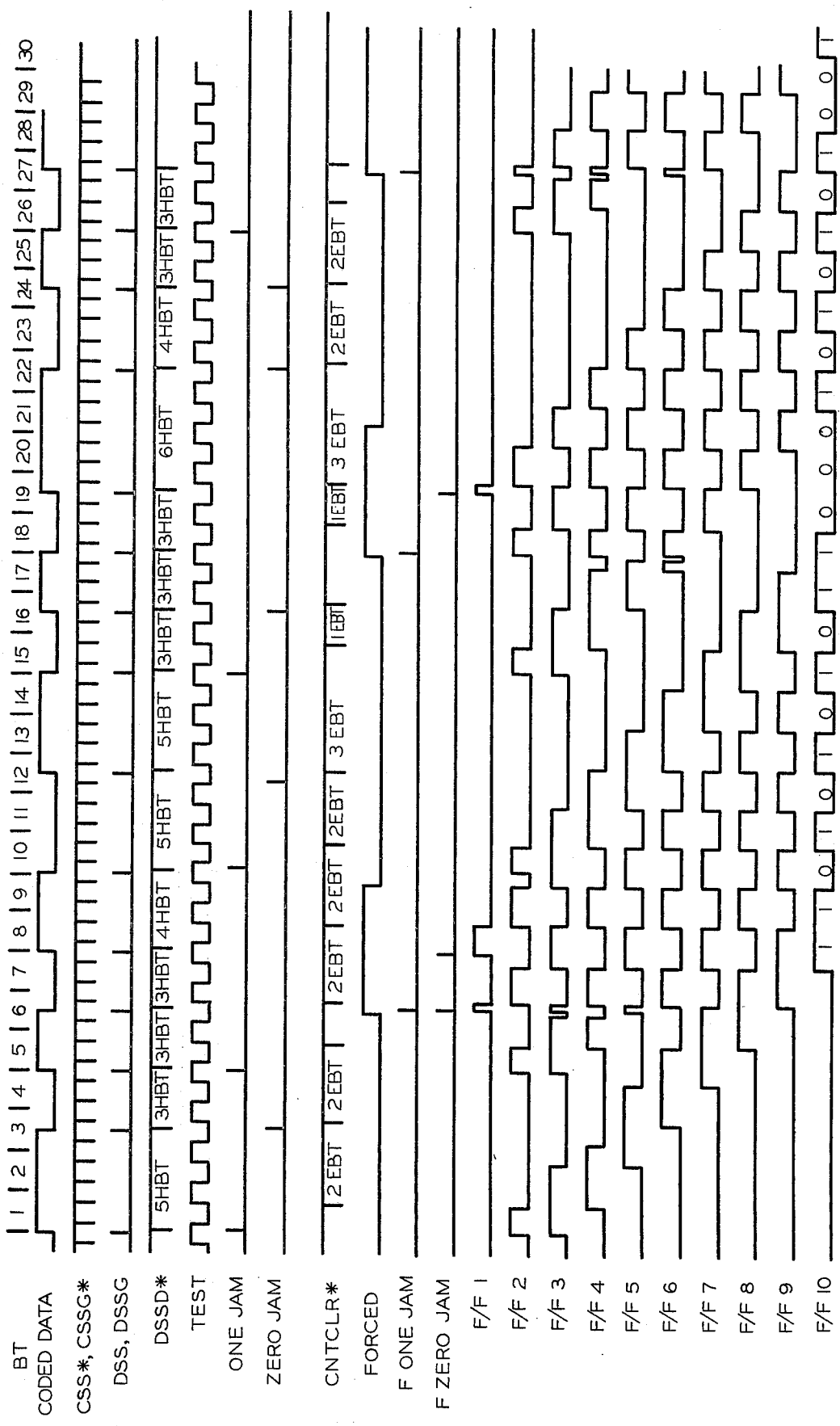
FIG. 9 is a timing chart somewhat idealized showing various voltage waveforms in the decoder of the present invention.

The operation of the decoder of the present invention will now be described with reference to the timing diagram of FIG. 9 utilizing the coded area generated by the encoder previously described.

The data transition occurring at the beginning of bit time 1 (BT1) produces a DSS pulse which occurs while TEST is high producing a ONE JAM pulse at the time of the DSSD* pulse. EBT2 is high at the time of the transition having been toggled to a high on the rising edge of TEST. Consequently, FF2 and FF3 of the register 80 are set high as a result of the ONE JAM pulse. On the next rising edge of TEST the flip-flops FF1 through FF10 are toggled shifting the data through the register 86. The DSSG* pulse also sets flip-flop 166 of the counter 84 high so that on the second rising edge of TEST following the transition CNTCLR* goes low clearing the elapsed bit time counter 82. In FIG. 9, the elapsed bit time between CNTCLR* pulses is indicated as is the half bit time count between DSSD* pulses. On DSSD* flip-flop 212 in the present half bit time counter 88 is set high so that the counter 88 counts the number of half bit times as represented by CSSG* which occur prior to the next transition. The next transition occurs in the middle of BT3 when HBT5 is high. Accordingly, on DSSG*, PHBT5 goes high and on DSSD*, ZERO JAM goes high and the flip-flops 214 through 222 of counter 88 are cleared while the flip-flop 212 of the counter 88 is set high. At the time of the ZERO JAM pulse, EBT2 is high so that FF4 of the register 86 is set high. FF4 at this particular time is, however, already high so that the setting has no effect. The next transition occurs at the beginning of BT5 producing a DSSG* pulse 3 half bit times since the last transition so that HBT3 of counter 88 is high causing PHBT3 of counter 90 to go high and PPHBT5 of counter 92 to go high. On the DSSD* pulse the flip-flops 214 through 222 of the counter 88 are cleared and the flip-flop 212 of the counter 88 is set high. At the same time, since DSSD* occurs while TEST is high a ONE JAM pulse is produced and since EBT2 is high, the flip-flops FF2 and FF3 of the register 80 are both set high. On the next transition which occurs at the middle of BT6, 3 half bit time have elapsed so that in addition to PPHBT5* being low, both PHBT3 and HBT3 are high so that the DSS pulse drives FORCED SET low setting the flip-flop 240 driving FORCED high and FORCED* low thereby disabling the bit pair jam control 78, enabling the FORCED mode jam control 96, clearing FF2 through FF6 of the register 80 and setting the flip-flops 172 through 178 of the elapsed bit time counter 82 high. The gates 292 through 298 of the logic 80 are thus enabled.

Since PPHBT5 is high the DSS pulse also passes through gate 254 to set flip-flop 258 of the following bit state storage element 98 thereby driving FOLW 0 high. The ONE JAM pulse which occurred during BT1 has previously set flip-flop 246 of the last pair transition block 100 high so that the PP STATE output of flip-flop 250 is high. With PP STATE and FOLW 0 both being high, the F1 TEST output of the logic 102 will be low as indicated in Chart A. Consequently, F0 TEST will be high and the DSSD* pulse occurring during BT6 produces an F ZERO JAM pulse which passes through gates 288, 292, and 296 to set flip-flops FF1, FF3, and FF5 high. On the next DSSD* pulse a second F0 JAM pulse is produced once again setting FF1, FF3 and FF5 high. In this particular instance FF3 and FF5 are already high so that the setting has no effect on these flip-flops.

It will be noted that there are four half bit time counts between the transition occurring at the beginning of BT8 and the transition occurring at the beginning of BT10. Consequently, on the fourth CSS pulse (the mirror image of the CSS* waveform shown) which occurs one gate time interval prior to the fourth CSSG* pulse HBT3 is also high causing the output of gate 238 of the detector 94 to go low clearing the flip-flop 240 driving FORCED* high and FORCED low thereby disabling the FORCED mode jam control 96 and enabling the bit pair jam control 78. Accordingly, the DSSD* pulse occurring at the beginning of BT10 produces a ONE JAM pulse which sets the flip-flops FF2 and FF3 high.

The transition occurring at the middle of BT12 produces a ZERO JAM which does not effect the counter since only two bit times have elapsed since the previous transition. The transition occurring at the beginning of BT15 produces a ONE JAM pulse which sets flip-flops FF2 and FF3 of the register 80. The transition occurring at the middle of BT16 has no effect on the register since only one bit time has elapsed since the previous transition.

The transition which occurs at the beginning of BT18 is the fourth of four successive transitions which are separated by 5, 3 and 3 half bit time counts and consequently, drives FORCED high. Since the first of the four successive transitions occur in the middle of BT12 and the second of the fourth transitions follows the first by five half bit times, the last legitimate pair transition is identified as a pair of 0's followed by a 0 driving PP STATE* high and FOLW 0 high which in turn drives F1 TEST high producing an F ONE JAM pulse which sets the flip-flops FF2, FF4, and FF6 high. Also, on the rising edge of the DSSD* pulse the flip-flop 278 of the logic 102 is toggled driving F0 TEST high. Accordingly, on the next transition, which occurs at the middle of BT19, an F0 JAM pulse is developed which sets the flip-flops FF1, FF3 and FF5 of the register 80. Since the next transition is greater than three half bit times later, FORCED is driven low on the fourth CSS pulse following the transition occurring at the middle of BT19. Consequently, the next transition occurring at the middle of BT22 produces a ZERO JAM as does the transition occurring in the middle of BT24. The transition occurring at the beginning of BT26 produces a ONE JAM pulse setting flip-flops FF2 and FF3 of the register 80.

The transition occurring in the middle of BT27 is the fourth of four successive transitions separated by 4, 3 and 3 half bit time intervals driving FORCED high clearing flip-flops FF2 through FF6 and producing an F ONE JAM pulse setting the flip-flops FF2, FF4 and FF6 of the register 80, setting a 10 alternate bit pattern into the flip-flops FF1 through FF6. The first of the four successive transitions occurred at the middle of BT22 while TEST* was high indicative of a pair of 0's which are located in flip-flop FF7 and FF8 at the time of the transition driving FORCED high and clearing the register 80. Consequently, while not shown in the waveforms, the pair of 0's will be followed by an alternate 10 bit pattern until consecutive transitions are separated by greater than three half bit times thereby developing at the output of FF10 the original NRZL bit stream of 010101010100101010100011010101011.

I claim:

1. Apparatus for converting an input bit stream the data of which is contained in the level of the input bit stream, to an output bit stream wherein the content of the data is contained in the time of transition of the output bit stream relative to bit time of the output bit stream, said apparatus comprising:

storage means;

clock means for shifting said input bit stream into said storage means, said clock means including means for establishing the bit time of said output bit stream;

means responsive to said clock means for comparing the level of adjacent bits in said input bit stream and for developing a control signal having pulses which occur at a first time with respect to bit time upon detection of a discrete pair of adjacent bits at one logic level and at a second time with respect to bit time upon detection of a discrete pair of adjacent bits at a second logic level and for generating pulses separated by 1½ bit time intervals when at least seven bits between discrete pairs of like bits form an alternate bit pattern, the first pulse of said 1½ bit time interval pulses occurring either 2 or 2½ bit times following the pulse corresponding to the detection of the first of said discrete pairs of like bits depending upon which alternate bit pattern is formed, the last pulse of said 1½ bit time interval pulses occurring at least 2 bit times prior to a pulse corresponding to detection of the second of said discrete pairs of like bits;

and means responsive to the pulses in said control signal for developing an output bit stream having state transitions corresponding to each pulse in said control signal.

2. Apparatus for converting an input bit stream wherein the content of the data is contained in the level of the input bit stream, to an output bit stream wherein the content of the data is contained in the relative time of state transitions of the output bit stream comprising:

storage means for storing at least nine successive bits of said input bit stream, clock means for serially shifting said input bit stream into said storage means at a predetermined bit rate, said clock means including means for establishing bit time of said output bit stream, first logic circuit means for detecting the storage of adjacent like bits of said input bit stream in said storage means and for developing a first control signal having a pulse which occurs at a first time with respect to bit time when the like bits detected are 1's and at a second time with respect to bit time when the like bits detected are 0's, said first logic means including means inhibiting further pulses in said first control signal for one bit time following detection of a pair of like bits, second logic circuit means for detecting the storage of an alternate bit pattern in said storage means of at least seven bits following a pair of like bits and for developing a second control signal having at least three pulses which occur at 1½ bit time intervals, the first pulse in said second control signal occurring at 2 or 2½ bit times after the pulse in said first control signal associated with a pair of like bits preceding said alternate bit pattern depending upon the state of the bit adjacent the pair of like bits, the last pulse of said second control signal occurring at least two bit times prior to a pulse in said first control signal associated with the pair of like bits following said alternate pattern, and means responsive to the pulses in said first and second control signal for developing an output bit stream having state transitions corresponding to each pulse in said first and second control signal.

3. Apparatus for converting an input bit stream the data content of which is contained in the level of the input bit stream, to an output bit stream wherein the content of the data is contained in the relative time of transition of the output bit stream, said apparatus comprising:

clock means synchronized with said input bit stream for generating a first clock pulse train at a predetermined frequency for establishing bit cell time, and for generating second and third clock pulse trains at said predetermined frequency and phase displaced from each other and from said first clock pulse train, a data storage register coupled with said clock means to be toggled in response to said first clock pulse train and capable of storing at least nine bits of data during any one bit cell time.

first gate means controlled by said second and third clock pulse trains and coupled to said register for detecting the level of bits stored in positions 8 and 9 of said register and for developing a first control signal containing pulses corresponding to pulses in said second clock pulse train if the bits stored in positions 8 and 9 of said register are a pair of 1's and pulses corresponding to pulses in said third clock pulse train if the bits are stored in positions 8 and 9 of the register are a pair of 0's.

second gate means coupled with said register for sensing the level of bits stored in positions 1 through 7 of said register for developing an output which is at one level when the bits stored in positions 1 through 7 of the register form a non-alternate bit pattern and at a second level if the bits stored in positions 1 through 7 of the register form an alternate 10 pattern, third gate means coupled with said register for sensing the level of bits stored in positions 1 through 7 of said register and for developing an output at one logic level if the bits stored in positions 1 through 7 of the register form a non-alternate bit pattern and at a second level if the bits stored in positions 1 through 7 of said register form an alternate 01 pattern, pulse generating means responsive to the output of said first, second, and third gate means for generating pulses separated by 1½ bit cell time intervals in response to detection of a pair of like bits in positions 8 and 9 of said register and an alternate bit pattern in positions 1 through 7 of said register, the first of said 1½ bit time pulses being generated either 2 or 2½ bit times following detection of a pair of like bits and one of said alternate bit patterns depending upon which of the two alternate bit patterns are stored in positions 1 through 7 of the register, means responsive to detection of a non-alternate bit pattern by said second or third gate means for disabling said pulse generating means at least two bit times prior to the storage in positions 8 and 9 of said register of the next pair of like bits following the alternate bit pattern, and output bit stream state controller means for developing an output bit stream having state changes corresponding to each pulse in said first control signal and each pulse output of said pulse generating means.

4. Apparatus for converting an input bit stream the data content of which is contained in the level of the input bit stream, to an output bit stream wherein the content of the data is contained in the time of state change relative to bit time, said apparatus comprising:

clock means synchronized with said input bit stream for generating a first clock pulse train at a predetermined frequency establishing bit time, and for generating second and third clock pulse trains at said predetermined frequency and phase displaced from each other and from said first clock pulse train, a data storage register coupled with said clock means to be toggled in response to said first clock pulse train and capable of storing at least nine bits of data during any one bit time, first gate means controlled by said second clock pulse train and coupled to said register for detecting the level of bits stored in positions 8 and 9 of said register and for developing a first control signal containing pulses representing the detection of pairs of 1's, second gate means controlled by said third clock pulse train and coupled with said register for detecting the level of bits stored in positions 8 and 9 of said register and for developing a second control signal containing pulses representing the detection of pairs of 0's.

third gate means coupled to the output of said first and second gate means for developing a third control signal containing pulses corresponding to each pulse in said first and second control signals, fourth gate means controlled by the output of said third gate means and coupled with said register for sensing the level of bits stored in positions 1 through 7 of said register and for developing a fourth control signal containing pulses corresponding to the pulses in said third control signal whenever an alternate bit pattern is stored in positions 1 through 7 of said register, fifth gate means controlled by the output of said fourth gate means and coupled to said register for detecting the level of bits stored in position 7 of said register and for developing a control signal containing pulses corresponding to the pulses in said fourth control signal if the level of the bits stored in position 7 of the register is a predetermined level, pulse generator means for generating a sixth control signal containing pulses separated by 1½ bit time intervals, means responsive to said fourth and fifth control signals for disabling said first and second gate means and for enabling said pulse generator means either 1 or ½ bit times thereafter depending upon the state of the bits stored in position 7 of said register, whereby the first pulse output of said pulse generating means in 2½ or 2 bit times after being enabled, sixth gate means coupled to said register for detecting the level of bits stored in two of said 1 through 7 positions of said register and for developing a control pulse at least two bit times prior to the storage of said two bits in positions 8 and 9 of the register if said two bits are alike for enabling said first and second gate means and for disabling said pulse generator means, means responsive to detection of a pair of like parts in positions 8 and 9 of said register for inhibiting for one bit time any subsequent detection of a pair of like bits in positions 8 and 9 of said register, and state controller means for changing the state of an output bit stream in response to a pulse in each of said third and sixth control signals.

5. Apparatus for converting an input bit stream, the data content of which is contained in the level of the input bit stream to an output bit stream wherein the content of the data is contained in the time of state change relative to bit time, said apparatus comprising:

clock means synchronized with said input bit stream for generating a first clock pulse train at a predetermined frequency establishing bit time and for generating second and third clock pulse trains at said predetermined frequency and phase displaced from each other and from said first clock pulse train, a data storage register coupled with said clock means to be toggled in response to said first clock pulse train and capable of storing at least nine bits of data during any one bit time, first gate means controlled by said second and third clock pulse train coupled to said register for detecting the level of bits stored in positions 8 and 9 of said register and for developing a first control signal containing pulses corresponding to pulses in said second clock pulse train if the bits stored in positions 8 and 9 of said register are a pair of 1's and pulses corresponding to pulses in said third clock pulse train if the bits stored in positions 8 and 9 of the register are a pair of 0's, second gate means coupled with said register for sensing the level of bits stored in positions 1 through 7 of said register and for developing an output which is at one level if the bits stored in positions 1 through 7 of the register form a nonalternate bit pattern and at a second level if the bits stored in positions 1 through 7 of the register form an alternate bit pattern, third gate means coupled with said register for sensing the level of the bits stored in position 7 of said register, pulse generating means responsive to the input of said first, second and third gate means for generating pulses separated by 1½ bit time intervals in response to detection of a pair of like bits in positions 8 and 9 of said register and an alternate bit pattern in positions 1 through 7 of said register, the first of said 1½ bit time pulses being generated either 2 or 2½ bit times following detection of a pair of like bits and one of said alternate bit pattern depending upon the level of the bit stored in position 7 of said register, means responsive to detection on a non-alternate bit pattern by said second gate means for disabling said pulse generating means at least two bit times prior to the storage in positions 8 and 9 of said register of the next pair of like bits following the alternate bit pattern, fourth gate means responsive to the output of said first gate means and coupled with said register for sensing the level of the bits stored in position 7 of said register for inverting the level of the bits stored in position 8 of said register when the bits stored in positions 7, 8 and 9 of said register are the same, and state controller means for developing an output bit stream having state changes corresponding to each pulse in said first control signal and each pulse output of said pulse generating means.

6. Apparatus for converting an input bit stream the data content of which is contained in the level of the input bit stream to an output bit stream wherein the content of the data is contained in the time of state change relative to bit time, said apparatus comprising:

clock means synchronized with said input bit stream for generating a first clock pulse at a predetermined frequency establishing bit cell time and for generating second and third clock pulse trains at said predetermined frequency and phase displaced from each other and from said first clock pulse train and for generating a fouth clock pulse train having pulses occurring at ½ bit cell time intervals, a data storage register capable of storing at least nine bits of said input bit stream at any one bit cell time, means coupling said register with said clock means for serially shifting said input bit stream through said register in response to said first clock pulse train, first gate means controlled by said second clock pulse train and coupled to said register for detecting the level of bits stored in positions 8 and 9 of said register and for generating a first control signal containing pulses representing the detection of a logic 1 level in positions 8 and 9 of said register, second gate means controlled by said third clock pulse train and coupled with said register for detecting the level of bits stored in positions 8 and 9 of said register and for developing a second control signal containing pulses representative of detection of a logic 0 level in positions 8 and 9 of said register, third gate means for detecting the level of bits stored in positions 1 through 7 of said register and for developing a third control signal which switches between one or the other of two signal levels in response to detection of an alternate 01 bit pattern or a non-alternate bit pattern respectively, fourth gate means coupled to said register for detecting the level of bits stored in positions 1 through 7 of said register and for generating a fourth control which switches between one or the other of two signal levels in response to detection of an alternate 10 bit pattern or a non-alternate bit pattern respectively, counter means comprising six triggerable flip-flops, each flip-flop having an output connected to the input of the following flip-flop, means coupling the last five flip-flops of said counter means to said clock means for simultaneously triggering each flip-flop in response to pulses in said fourth clock pulse train to transfer the output of each flip-flop to the output of the following flip-flop, fifth gate means for ORing the outputs of said first and second gate means and the output of the last flip-flop of said counter means, sixth gate means responsive to the outputs of said third, fourth, and fifth gate means for setting the first flip-flop of said counter means and for disabling said first and second gate means, seventh gate means responsive to the output of said sixth gate means and to the logic level of the bits stored in position 7 of said register for setting the second flip-flop in said counter means whenever the logic level of the bit in position 7 of said register is at a predetermined level whereby the first pulse output of said counter means occurs 2½ bit times following the setting of the first flip-flop unless the bits stored in position 7 is at said predetermined level, in which event the first pulse output of said counter occurs 2 bit times following the setting of the said first and second flip-flops in said counter means, means responsive to the output of said counter means for clearing the last three flip-flops of said counter means whereby succeeding pulses generated by said counter means occur at 1½ bit time intervals, eighth gate means coupled to said register for sensing the level of the bits stored in positions 5 and 6 of said register for developing an output signal which switches to a predetermined level when the bits stored in positions 5 and 6 of said register are the same, ninth gate means responsive to the output of said eighth gate means and the output of said counter means for disabling said counter means and enabling said first and second gate means on the next pulse output of said counter means following a change in the output of said eighth gate means to said predetermined level, tenth gate means responsive to the level of the bits stored in positions 7 and 8 of said register for inverting the level of bit stored in position 8 of said register if the bits stored in positions 7 and 8 of said register are the same in response to a pulse in the output signal of said fifth gate means, and output state controller means for developing an output bit stream having state changes corresponding to the output pulses of said fifth gate means.

7. Apparatus for encoding binary data comprising:

clocking means for forming a plurality of bit cells of substantially uniform time durations, logic means responsive to said binary data and to said clocking means to provide an output signal having two separately identifiable states, said logic means responding to pairs of adjacent bits forming a predetermined two bit configuration or the complement thereof by providing a bit pair transition between said separately identifiable states at respectively the leading edge or midpoint of one of the two bit cells containing said pair of adjacent bits unless the first of said two bit cells is preceded by a bit cell having a transition therein, said logic means responding to a bit pattern of predetermined bit length which contains no pairs of adjacent bits forming either said predetermined two bit configuration or the complement thereof by producing at least three consecutive transitions between said separately identifiable states separated by 1½ bit cell times, the first and last of said consecutive transitions separated by 1½ bit cell times occurring at least two bit cells displaced from the preceding and following bit pair transitions respectively, the first of said consecutive transitions separated by 1½ bit cell times being produced at the beginning or middle of a bit cell depending upon whether the first bit of said bit pattern is of one or the other binary characterization respectively.

* * * * *

UNITED STATES PATENT AND TRADEMARK OFFICE
CERTIFICATE OF CORRECTION

PATENT NO. : 4,001,811

DATED : January 4, 1977

INVENTOR(S) : Duane E. McIntosh

It is certified that error appears in the above-identified patent and that said Letters Patent are hereby corrected as shown below:

Column 1, line 44, "transistors" should read -- transitions --.

Column 5, line 14, before "times" insert -- bit --.

Column 7, line 25, "piar" should read -- pair --.

line 33, "transition" should read -- transition, --.

Column 9, line 8, "DSSG*." should read -- it --.

line 17, "DSSG:." should read -- DSSG*. --.

Column 12, line 8, the numeral "176" should read the numeral -- 276 --.

Column 15, line 68, "when" should read -- if --.

Column 16, line 13, "a" should read -- the --.

line 54, "when" should read -- if --.

UNITED STATES PATENT AND TRADEMARK OFFICE
CERTIFICATE OF CORRECTION

PATENT NO. : 4,001,811

DATED : January 4, 1977

INVENTOR(S) : Duane E. McIntosh

It is certified that error appears in the above-identified patent and that said Letters Patent are hereby corrected as shown below:

Column 18, line 12, "in" should read -- is --.

line 22, "parts" should read -- bits --.

line 66, "input" should read -- output --.

Signed and Sealed this

Thirty-first Day of May 1977

[SEAL]

Attest:

RUTH C. MASON
Attesting Officer

C. MARSHALL DANN
Commissioner of Patents and Trademarks